US006787793B2

(12) United States Patent
Yoshida

(10) Patent No.: US 6,787,793 B2
(45) Date of Patent: Sep. 7, 2004

(54) STRAINED SI DEVICE WITH FIRST SIGE LAYER WITH HIGHER GE CONCENTRATION BEING RELAXED TO HAVE SUBSTANTIALLY SAME LATTICE CONSTANT AS SECOND SIGE LAYER WITH LOWER GE CONCENTRATION

(75) Inventor: Akira Yoshida, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/299,017

(22) Filed: Nov. 19, 2002

(65) Prior Publication Data

US 2003/0107032 A1 Jun. 12, 2003

(30) Foreign Application Priority Data

Dec. 11, 2001 (JP) .......................................... 2001-377603

(51) Int. Cl.[7] ..................... H01L 29/06; H01L 31/0328; H01L 31/0336; H01L 31/072; H01L 31/109
(52) U.S. Cl. .............................. 257/19; 257/18; 257/15; 257/55
(58) Field of Search .............................. 257/55, 15, 18, 257/19, 190

(56) References Cited

U.S. PATENT DOCUMENTS

| | | | | |
|---|---|---|---|---|
| 5,461,250 A | * | 10/1995 | Burghartz et al. | .......... 257/347 |
| 5,523,592 A | * | 6/1996 | Nakagawa et al. | ........... 257/96 |
| 6,059,895 A | * | 5/2000 | Chu et al. | .................. 148/33.1 |
| 6,154,475 A | * | 11/2000 | Soref et al. | .................... 372/45 |
| 6,346,452 B1 | * | 2/2002 | Kabir et al. | ................. 438/312 |
| 6,350,993 B1 | * | 2/2002 | Chu et al. | ...................... 257/19 |
| 6,403,976 B1 | * | 6/2002 | Saitoh et al. | .................. 257/19 |
| 6,407,406 B1 | * | 6/2002 | Tezuka | ......................... 257/18 |
| 6,507,091 B1 | * | 1/2003 | Skotnicki et al. | ........... 257/613 |
| 6,555,839 B2 | * | 4/2003 | Fitzgerald | ..................... 257/18 |
| 2002/0052061 A1 | * | 5/2002 | Fitzgerald | ..................... 438/46 |
| 2002/0104993 A1 | * | 8/2002 | Fitzgerald et al. | ............ 257/65 |
| 2002/0125475 A1 | * | 9/2002 | Chu et al. | ...................... 257/55 |

FOREIGN PATENT DOCUMENTS

JP            10-256169            9/1998

OTHER PUBLICATIONS

Mii et al.; "Extremely High Electron Mobility in Si/Ge$_x$Si$_1$ Structures Grown by Molecular Beam Epitaxy"; *Appl. Phys. Lett. 59*; Sep. 23, 1991; pp 1611–1613.

Follstaedt et al.; "Cavity–Dislocation Interactions in Si–Ge and Implications for Heterostructure Relation"; *Appl. Phys. Lett. 69*; Sep. 30, 1996; pp. 20592061.

Trinkaus et al.; "Strain Relaxation Mechanism for Hydrogen–Implanted Si$_{1-x}$Ge$_x$/Si(100) Heterostructures"; *Appl. Phys. Lett. 76*; Jun. 12, 2000; pp 3552–3554.

* cited by examiner

*Primary Examiner*—Mary Wilczewski
*Assistant Examiner*—Monica Lewis
(74) *Attorney, Agent, or Firm*—Nixon & Vanderhye P.C.

(57) ABSTRACT

A semiconductor device comprises a first $Si_{1-\alpha}Ge_\alpha$ film, a first cap film, a second $Si_{1-\beta}Ge_\beta$ film ($\beta<\alpha\leq 1$) and a second cap film formed in this order on a substrate whose surface is formed of silicon, wherein the first $Si_{1-\alpha}Ge_\alpha$ film is relaxed to have substantially the same lattice constant as that of the second $Si_{1-\beta}Ge_\beta$ film in a horizontal plane.

6 Claims, 4 Drawing Sheets

STRAINED SI DEVICE WITH FIRST SIGE LAYER WITH HIGHER GE CONCENTRATION BEING RELAXED TO HAVE SUBSTANTIALLY SAME LATTICE CONSTANT AS SECOND SIGE LAYER WITH LOWER GE CONCENTRATION

CROSS-REFERENCE TO RELATED APPLICATION

This application is related to Japanese Patent Application No. 2001-377603 filed on Dec. 11, 2001, whose priority is claimed under 35 USC § 119, the disclosure of which is incorporated by reference in its entirety.

BACKGROUND OF THE INVENTION

1. Field of the Invention

The present invention relates to a semiconductor device and its production process, more particularly, a semiconductor device using a semiconductor substrate into which strain is introduced by providing a SiGe film and a process of producing the semiconductor device.

2. Description of Related Art

For the purpose of improving the mobility of carriers (electrons or holes) passing through channel regions, there is known a technique of forming a strained SiGe pseudomorphic film on a Si substrate, relaxing the strain of the film caused by lattice mismatch between the film and the substrate by introducing misfit dislocation, and forming a Si film as a cap layer. The Si film is strained by the SiGe film having a larger lattice constant, thereby changing a band structure and improving the mobility of carriers.

For relaxing the strain of the SiGe film, there is known a technique of forming a SiGe film in a thickness of several $\mu$m to increase the resilience of the SiGe film, thereby relaxing the strained SiGe film. For example, Y. J. Mii et al. published the relaxation of a strained SiGe film by forming a SiGe film of about 1 $\mu$m thickness with a increasingly graded Ge concentration profile in Appl. Phys. Lett. 59(13), 1611(1991)].

Also, for relaxing the strain of a thin SiGe film, there is known a technique of producing misfit dislocation at a SiGe film/Si substrate interface by high-temperature annealing after implantation of ions such as hydrogen ions and thereby causing the slipping of stacking fault in a defect layer in the Si substrate. For example, D. M. Follstaedt et al. published the relaxation of strain by He ion implantation in Appl. Phys. Lett. 69(14), 2059(1996), and H. Trinkaus et al. published the relaxation of strain by H ion implantation in Appl. Phys. Lett. 76(24), 3552(2000).

As a technique of relaxing the strain of a thin SiGe film without implantation of ions such as hydrogen ions, Japanese Unexamined Patent Publication HEI 10(1998)-256169 proposed a technique of forming a Ge layer of 20 nm thickness on a Si substrate, forming thereon a SiGe cap layer of 1 nm or smaller thickness and annealing at 680° C. for 10 minutes, thereby relaxing the Ge layer.

Further, Sugimoto et al. published a technique of relaxing strain in the 31$^{st}$ workshop material, page 29 of the 154$^{th}$ committee "Semiconductor Interface Control Technology" of the Japan Society for the Promotion of Science. According to this technique, a first SiGe film and a first Si cap film are formed on a Si substrate in this order at a temperature as low as 400° C., annealed at 600° C. to generate a low-density misfit dislocation at a SiGe film/Si substrate interface. Subsequently, a second SiGe film is grown at a temperature as high as 600° C. Thereby, an undulation is generated on the surface of the growing SiGe film due to influence of strain fields caused by the misfit dislocation at the SiGe film/Si substrate interface. By compressive stress on troughs of the undulation, dislocation generation sites are newly introduced. Thereby the strain is relaxed while the second SiGe film is grown. According to this technique, threading dislocation in the first SiGe film caused by the misfit dislocation at the first SiGe film/Si substrate interface is reduced by forming the first Si cap film. Further, even if the first SiGe film is formed to have a high Ge concentration (30%), the second SiGe film can be relaxed about 90%.

In the above-mentioned relaxation technique by forming the thick SiGe film to increase the resilience of the SiGe film, an extremely large number of defects are generated in the SiGe film, because the thickness of the SiGe film exceeds a critical thickness for obtaining perfect crystal.

In the technique of high-temperature annealing after implantation of ions such as hydrogen ions, since only the first SiGe film and the first Si cap film form a heterostructure, threading dislocation caused by the misfit dislocation at the SiGe film/Si substrate interface reaches the surface in a high density (about $10^7/cm^2$), which results in an increase in a junction leakage current after a semiconductor device is formed. Further, protrusions called cross-hatches are produced by the threading dislocation and remaining resilience. In addition to that, if the Ge concentration of the SiGe film becomes high, large holes are liable to emerge owing to hydrogen ions at the SiGe/Si interface, and a very large surface roughness is likely to occur on the surface of the SiGe film.

Further, if the technique of Japanese Unexamined Patent Publication HEI 10 (1998)-256169 is applied to the technique of forming the SiGe film and the Si cap film on the Si substrate to relax the SiGe film, the relaxation ratio declines greatly where the strained SiGe film is thinner than the critical thickness. For example, according to the above 31$^{st}$ workshop material, if the same construction as disclosed by Japanese Unexamined Patent Publication HEI 10 (1998)-256169 is formed under SiGe film formation conditions of a substrate temperature of 400° C., a Ge concentration of 30% and a thickness of 100 nm or smaller, which is below the critical thickness, and is annealed at 600° C. for five minutes, the strained $Si_{0.7}Ge_{0.3}$ film is relaxed only about 20%. Therefore, the Si cap film on the top cannot be strained sufficiently, and the carrier mobility cannot be raised to a targeted level.

In the technique of growing the second SiGe film on the first Si cap film/first SiGe film/Si substrate structure while relaxing strain, an undulation of great amplitude (rms: about 9 nm) remains on the surface of the second SiGe film owing to the influence of strained fields by a low-density misfit dislocation and due to film growth at a high temperature.

SUMMARY OF THE INVENTION

The present invention has been made in view of the above-discussed problems. An object of the present invention is to provide a semiconductor device and its production process which can achieve a high strain relaxation degree and reduce the threading dislocation density even in a strained SiGe film having a high Ge concentration and a thickness not greater than the critical thickness, and, regarding a second SiGe film formed thereon, can suppress undulation therein, obtain as complete relaxation as possible and improve its smoothness.

The present invention provides a semiconductor device a semiconductor device comprising a first $Si_{1-\alpha}Ge_\alpha$ film, a first cap film, a second $Si_{1-\beta}Ge_\beta$ film ($\beta<\alpha\leq1$) and a second cap film formed in this order on a substrate whose surface is, formed of silicon, wherein the first $Si_{1-\alpha}Ge_\alpha$ film is relaxed to have substantially the same lattice constant as that of the second $Si_{1-\beta}Ge_\beta$ film in a horizontal plane.

The present invention also provides a process of producing a semiconductor device which comprises a first $Si_{1-\alpha}Ge_\alpha$ film, a first cap film, a second $Si_{1-\beta}Ge_\beta$ film ($\beta<\alpha\leq1$) and a second cap film formed in this order on a substrate whose surface is formed of silicon, the first $Si_{1-\alpha}Ge_\alpha$ film being relaxed to have substantially the same lattice constant as that of the second $Si_{1-\beta}Ge_\beta$ film in a horizontal plane, the process comprising the steps of:

(a) forming a first $Si_{1-\alpha}Ge_\alpha$ film on a substrate whose surface is formed of silicon;

(b) forming a first cap film on the first $Si_{1-\alpha}Ge_\alpha$ film;

(c) annealing the resulting substrate to relax the first $Si_{1-\alpha}Ge_\alpha$ film so that the lattice constant of the first $Si_{1-\alpha}Ge_\alpha$ film becomes substantially the same as the lattice constant of a second $Si_{1-\beta}Ge_\beta$ film which is to be formed on the cap film and satisfies $\beta<\alpha\leq1$;

(d) forming the second $Si_{1-\beta}Ge_\beta$ film on the first cap film; and (e) forming a second cap film on the second $Si_{1-\beta}Ge_\beta$ film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
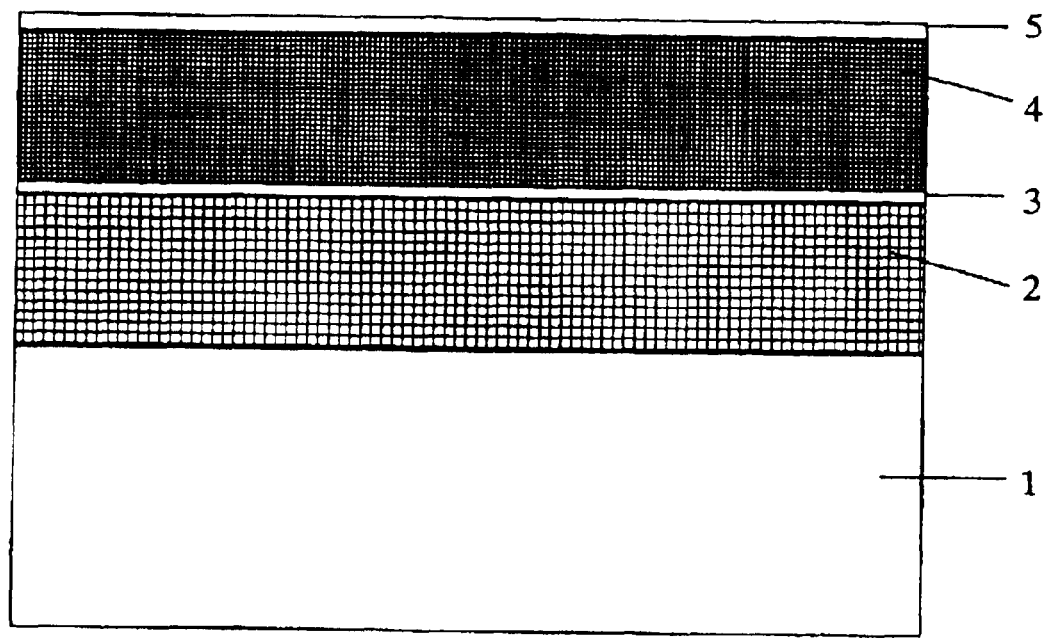
FIG. 1 is a schematic sectional view of a major part of a semiconductor device in accordance with an embodiment of the present invention.

According to the process of producing a semiconductor device of the present invention, in step (a), a first $Si_{1-\alpha}Ge_\alpha$ film is formed on a substrate having a silicon surface.

The substrate having the silicon surface includes substrates of amorphous, microcrystal, single-crystal and polycrystalline silicon, substrates of silicon having two or more of the above-mentioned crystal structures mixed, and so-called SOI, SOS substrates having surface layers of silicon of these crystal structures. Among these substrates, a substrate of single-crystal silicon and an SOI substrate whose surface layer is formed of single-crystal silicon are preferred. The SOI substrate may be formed by various methods such as a SIMOX method, a method using selective etching of porous silicon, a laminating method and the like.

The first $Si_{1-\alpha}Ge_\alpha$ film may be formed by known various methods, for example, CVD, sputtering, vacuum deposition, MEB or the like methods. Among these methods, the first $Si_{1-\alpha}Ge_\alpha$ film may preferably be epitaxially grown by a CVD method. The film forming conditions in this case may be selected from those known in the field of art, and the film forming temperature (the temperature of the substrate), in particular, may suitably be about 400 to 650° C., for example. In this $Si_{1-\alpha}Ge_\alpha$ film, the concentration of Ge represented by a is not particularly limited so long as it satisfies $\beta<\alpha\leq1$, but may be, for example, about 10 to 100 atom %, preferably about 30 to 50 atom %. The thickness of the $Si_{1-\alpha}Ge_\alpha$ film is preferably a critical thickness or smaller. The critical thickness means the maximum thickness up to which the SiGe film can grow on a substrate with maintaining a completely strained state. More particularly, if the SiGe film having a Ge concentration within the above-mentioned range is formed on a substrate having a silicon surface, the thickness of the SiGe film is about 500 nm or smaller, preferably about 50 nm to 280 nm depending upon the Ge concentration. The Ge concentration may be varied in a continuously or stepwise inclined manner in a film thickness direction and in an in-plane direction (a horizontal plane direction), but is preferably uniform.

In step (b), a first cap film is formed on the first $Si_{1-\alpha}Ge_\alpha$ film. The first cap film is preferably formed of a semiconductor of a diamond structure similar to that of silicon. More particularly, the first cap film may be a Si film, a SiC film or a SiGe film having a Ge concentration lower than the Ge concentrations of the first SiGe film and a second SiGe film later described. The C concentration of the SiC film is not particularly limited, but may be about 0.1 to 7 atom %, for example. The Ge concentration of the SiGe cap film may suitably be about 10 atom % or less. The first cap film can be formed by a method similar to that for forming the first SiGe film. In this case, the temperature of the substrate is preferably about 400 to 650° C. The thickness of the first cap film is preferably not greater than the critical thickness. In addition to that, it is preferable that the first cap film is thinner as the Ge concentration of the underlying first $Si_{1-\alpha}Ge_\alpha$ film is higher and/or as the annealing temperature is higher in a later step of the semiconductor device production process. More particularly, the first cap film is suitably about 1 to 100 nm, particularly suitably about 5 to 30 nm thick.

In step (c), the resulting substrate is annealed to relax the first $Si_{1-\alpha}Ge_\alpha$ film. The annealing process here is performed until the lattice constant of the first $Si_{1-\alpha}Ge_\alpha$ film becomes substantially the same as the lattice constant of the second $Si_{1-\beta}Ge_\beta$ film ($\beta<\alpha\leq1$) to be formed on the first cap film later. In the present invention, the lattice constant means a lattice constant in the horizontal plane direction unless otherwise defined. The annealing process can be performed by use of a method and conditions known in the field of art except that the process is performed in a state where the cap film is formed on the first SiGe film. The annealing process may be carried out by use of an oven, a lamp, an RTA and the like suitably in an atmosphere of an inert gas, air, nitrogen gas, oxygen gas or hydrogen gas at a temperature of 600 to 900° C. for about 5 to 30 minutes.

Here, that the lattice constant of the first $Si_{1-\alpha}Ge_\alpha$ film becomes substantially the same as the lattice constant of the second $Si_{1-\beta}Ge_\beta$ film ($\beta<\alpha\leq1$) to be formed on the first cap film means that the second $Si_{1-\beta}Ge_\beta$ film has a $\beta$ value satisfying $\beta<\alpha\leq1$ and the first $Si_{1-\alpha}Ge_\alpha$ film has substantially the same lattice constant as that of the second $Si_{1-\beta}Ge_\beta$ film when the second $Si_{1-\beta}Ge_\beta$ film is substantially totally relaxed. Preferably, the first $Si_{1-\alpha}Ge_\alpha$ film is relaxed so that it has the same lattice constant as that of the second $Si_{1-\beta}Ge_\beta$ film to be formed later or so that it has an effective lattice constant of a $Si_{0.7}Ge_{0.3}$ film ($\alpha=0.3$). From another point of view, the first $Si_{1-\alpha}Ge_\alpha$ film may be relaxed so that its lattice constant is substantially equal to that of the second $Si_{1-\beta}Ge_\beta$ film with a difference up to ±0.001 Å, ±0.0001 Å or ±0.00001 Å. In other words, the lattice constants of the first $Si_{1-\alpha}Ge_\alpha$ film and the second $Si_{1-\beta}Ge_\beta$ film may be the same or only different preferably by ±3% or less, by ±2.5% or less, more preferably by ±2% or less, by ±1.5% or less, still more preferably by ±1% or less, by ±0.5% or less.

Figure 3:
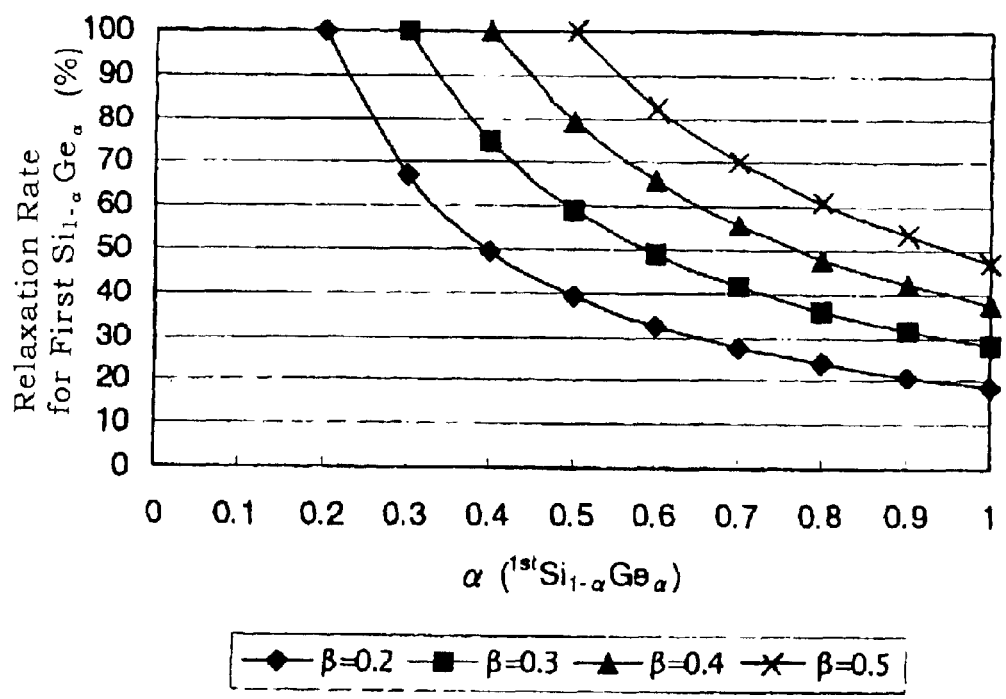
FIG. 3 is a graphical representation showing a relaxation ratio of a first $Si_{1-\alpha}Ge_\alpha$ film required for obtaining a totally relaxed second $Si_{1-\beta}Ge_\beta$ film.

For example, the lattice constant can be set with reference to a relation of the relaxation rate for the first $Si_{1-\alpha}Ge_\alpha$ film necessary for realizing the totally relaxed second $Si_{1-\beta}Ge_\beta$ film as shown in FIG. 3. More particularly, if the Ge concentration $\alpha$ of the first $Si_{1-\alpha}Ge_\alpha$ film is 0.9 and the Ge concentration $\beta$ of the second $Si_{1-\beta}Ge_\beta$ film is 0.3, the first $Si_{1-\alpha}Ge_\alpha$ film will have substantially the same lattice constant as that of the second $Si_{1-\beta}Ge_\beta$ film when the first $Si_{1-\alpha}Ge_\alpha$ film is relaxed about 32%. If $\alpha$ is 0.5 and $\beta$ is 0.2, the relaxation rate R of the first $Si_{1-\alpha}Ge_\alpha$ film should be about 39.4%. If $\alpha$ is 1 and $\beta$ is 0.2, the relaxation rate R should be about 18.6%.

In step (c), before the annealing process, the substrate with the first cap film formed thereon may be implanted with ions. This ion implantation is suitably performed with use of an element capable of introducing crystal defect into the silicon surface of the substrate, an element capable of forming microcavities in the substrate during the annealing process after the ion implantation, or the like. For example, such an element can be selected from the group consisting of hydrogen, inert gases and Group IV elements. More particularly, may be mentioned hydrogen, helium, neon, silicon, carbon, germanium and others, among which hydrogen is preferred. The acceleration energy of the ion implantation can be selected as appropriate depending upon an ion species used, the thickness of the first $Si_{1-\alpha}Ge_\alpha$ film and the material and thickness of the first cap film. For suppressing defect in the first $Si_{1-\alpha}Ge_\alpha$ film and preventing the first $Si_{1-\alpha}Ge_\alpha$ film from being thinner, the acceleration energy may be set so that the implantation peak is, for example, on a substrate side of the first $Si_{1-\alpha}Ge_\alpha$ film/substrate interface, more particularly, about 20 nm or more (preferably about 30 to 70 nm) below the interface within the substrate. For example, the acceleration energy may be about 20 to 150 keV. More specifically, if the first $Si_{1-\alpha}Ge_\alpha$ film is about 200 nm thick and hydrogen is used, it may be about 18 to 25 keV. The dose may be, for example, about $1\times10^{15}$ to $1\times10^{17}$ cm$^{-2}$, and more preferably, about $1\times10^{16}$ to $1\times10^{17}$ cm$^{-2}$. In the case of other ion species, other thickness of the first $Si_{1-\alpha}Ge_\alpha$ film or the like, the conditions may be set as appropriate according to the above conditions.

The ion implantation is not necessarily required to be done immediately after the first cap film is formed, but may be done after a protecting film is formed above the first $Si_{1-\alpha}Ge_\alpha$ film. The protecting film here is not particularly limited regarding its material and thickness and may be either an insulating film or a semiconductor film. More particularly, the protecting film may be a thermally oxidized film, a low-temperature oxidized film (LTO film), a high-temperature oxidized film (HTO film), a silicon oxide film formed by P-CVD, a silicon nitride film or the like. The thickness thereof may be about 20 to 150 nm, for example.

In step (d), the second $Si_{1-\beta}Ge_\beta$ film is formed on the first cap film. The second $Si_{1-\beta}Ge_\beta$ film can be formed in the same thickness by the same method as the first SiGe film. However, the second $Si_{1-\beta}Ge_\beta$ film does not necessarily need to have the same thickness. The second $Si_{1-\beta}Ge_\beta$ film is substantially totally relaxed, that is, the lattice constant of the second $Si_{1-\beta}Ge_\beta$ film is the same as the theoretical lattice constant of a $Si_{1-\beta}Ge_\beta$ film, or preferably the second $Si_{1-\beta}Ge_\beta$ film is relaxed so that it has an effective lattice constant of a $Si_{0.7}Ge_{0.3}$ film ($\beta=0.3$). From another point of view, the second $Si_{1-\beta}Ge_\beta$ film may be relaxed so that its lattice constant is substantially equal to the theoretical lattice constant of the second $Si_{1-\beta}Ge_\beta$ film with a difference up to ±0.001 Å, ±0.0001 Å or ±0.00001 Å. In other words, the lattice constants of the second $Si_{1-\beta}Ge_\beta$ film may be the same as the theoretical value of $Si_{1-\beta}Ge_\beta$ film or only different therefrom preferably by ±3% or less, by ±2.5% or less, more preferably by ±2% or less, by ±1.5% or less, still more preferably by ±1% or less, by ±0.5% or less.

In step (e), a second Si cap film is formed on the second $Si_{1-\beta}Ge_\beta$ film. The second Si cap film can be formed by the same method as the first cap film. The thickness is preferably not greater than the critical film thickness, and more particularly about 1 to 100 nm, more preferably about 5 to 40 nm.

In the process of producing the semiconductor device of the present invention, it is not always necessary that only the above-described steps (a) to (e) are carried out in the above-mentioned order. For example, the protecting film may be formed on the first cap layer, the ion implantation and/or the annealing process may be performed, then the protecting film may be removed, and thereafter the step (d) may be carried out. The type and thickness of the protecting film are as described above. The protecting film may be removed by a method known in the field of art, such as wet etching using an alkali solution, dry etching or the like.

Alternatively, the protecting film may be formed on the first cap film, the ion implantation may be performed, then the protecting film is removed, and thereafter the annealing process may be performed.

After the first SiGe film, the first cap film and the second SiGe film and the second Si cap film are formed on the substrate as described above, the semiconductor device can be completed by forming a device isolation region, forming a gate insulating film and a gate electrode, forming an LDD region and/or a DDD region and/or source and drain regions, forming an interlayer insulating film, an wiring layer, etc., according to a usual semiconductor production process.

The semiconductor device and its production process of the present invention are now described in detail by way of embodiment thereof with reference to the attached drawings.

Embodiment 1

A semiconductor device in this embodiment is constructed, as shown FIG. 1, to have a first $Si_{0.1}Ge_{0.9}$ film 2 of 1 nm thickness, a first Si cap film 3 of 5 nm thickness, a second $Si_{0.7}Ge_{0.3}$ film 4 of 200 nm thickness and a second Si cap film 5 of 20 nm thickness formed in this order on the (001) plane of a silicon substrate 1, further a gate insulating film (not shown), a gate electrode (not shown) and source/drain regions (not shown) being formed thereon.

The first $Si_{0.1}Ge_{0.9}$ film 2 is relaxed about 32%, has a lattice constant $a_{//}$ of 5.49477 Å in a plane parallel to the (001) plane. This lattice constant is substantially the same as that of the second $Si_{0.7}Ge_{0.3}$ film 4.

This semiconductor device can be formed in the following way.

Figure 2A:
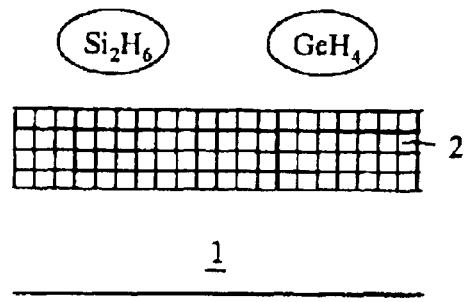
FIGS. 2(a) to 2(d) are schematic sectional views of a major part illustrating a process for producing a semiconductor device in accordance with an embodiment of the present invention.

First, a silicon substrate was ashed with boiled sulfuric acid and RCA-cleaned for pre-treatment and then a naturally oxidized film was removed from the surface of the silicon substrate with a 5% dilute hydrofluoric acid. Next, as shown in FIG. 2(a), a first pseudomorphic $Si_{0.1}Ge_{0.9}$ film 2 having a Ge concentration of 90% was epitaxially grown to a thickness of 1 nm on the (001) plane of the silicon substrate 1 at 500° C. by a low-pressure chemical vapor deposition (LP-CVD) apparatus using germane ($GeH_4$) and disilane ($Si_2H_6$) as materials. The first $Si_{0.1}Ge_{0.9}$ film 2 formed under these conditions had a thickness not greater than the critical thickness.

Since the first $Si_{0.1}Ge_{0.9}$ film 2 was totally matched with the Si substrate, the lattice constant $a_{//}$ in the plane parallel to the (001) plane was the same as that of Si (about 5.43094 Å), and the lattice constant $a\perp$ in a plane perpendicular to the (001) plane was about 5.78704 Å. Since the lattice constant of a totally relaxed $Si_{0.1}Ge_{0.9}$ film met $a_{//}=a\perp=5.633943$ Å, the first $Si_{0.1}Ge_{0.9}$ film 2 was strained to extend in the vertical direction. With regard to the first $Si_{0.1}Ge_{0.9}$ film 2 totally matched with the silicon substrate 1, X-ray diffractometry of its (004) plane showed $2\theta=64.33967°$.

Figure 2B:
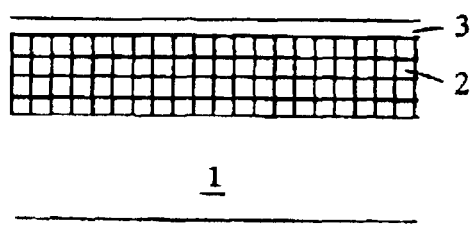

Subsequently, as shown in FIG. 2(b), a first pseudomorphic Si cap film 3 was epitaxially grown to a thickness of 5 nm on the first SiGe film 2 at 500° C. by the LP-CVD apparatus for preventing the contamination of the LP-CVD apparatus with Ge and improving the smoothness the first Si cap film.

The resulting substrate was annealed in an oven at 870° C. for 10 minutes and thereby the first $Si_{0.1}Ge_{0.9}$ film 2 was relaxed.

If a $Si_{0.7}Ge_{0.3}$ film was to be formed as the second SiGe film on the first Si cap film 3, the first $Si_{0.1}Ge_{0.9}$ film 2 was required to be relaxed to have $a_{//}=5.49477$ Å (which corresponded to a relaxation ratio R=31.4%) in order to obtain the totally relaxed second $Si_{0.7}Ge_{0.3}$ film 4 later, because the totally relaxed second $Si_{0.7}Ge_{0.3}$ film should have $a_{//}=a\perp=5.49477$ Å. Since $a\perp$ was 5.73890 Å when the first $Si_{0.1}Ge_{0.9}$ film 2 had $a_{//}=5.49477$ Å, the first $Si_{0.1}Ge_{0.9}$ film 2 may be relaxed until the X-ray diffractometry of the (004) plane showed $2\theta=64.94524°$.

Figure 2C:
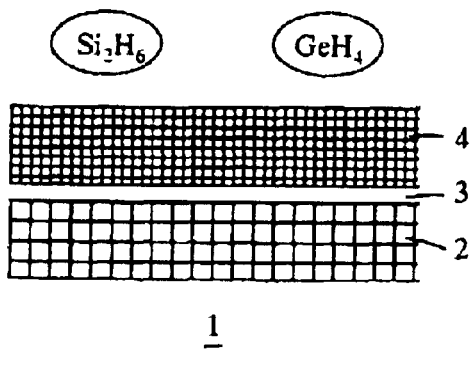

Subsequently, as shown in FIG. 2(c), a second pseudomorphic $Si_{0.7}Ge_{0.3}$ film 4 having a Ge concentration of 30% was epitaxially grown to a thickness of 200 nm on the first Si cap film 3 at 500° C. by the LP-CVD apparatus using germane and disilane as materials. Since this second $Si_{0.7}Ge_{0.3}$ film 4 was pseudomorphically formed on the first Si cap film 3 which was totally matched with the first $Si_{0.1}Ge_{0.9}$ film 2 having the same lattice constant $a_{//}$ as that of the second $Si_{0.7}Ge_{0.3}$ film 4 in the plane parallel to the (001) plane and, the X-ray diffractometry of the (004) plane of the second $Si_{0.7}Ge_{0.3}$ film 4 showed $2\theta=68.21547°$. That confirmed 100% relaxation. Since the second $Si_{0.7}Ge_{0.3}$ film 4 was totally relaxed, the residual strain energy in the film was small, and therefore, the surface was very smooth. The observation of the surface of the second $Si_{0.7}Ge_{0.3}$ film 4 with an atomic force microscope showed that the second $Si_{0.7}Ge_{0.3}$ film 4 was as smooth as the silicon substrate, exhibiting an average roughness rms of 0.4 nm. This small roughness was very effective in preventing the decline of the mobility of carriers owing to surface scattering. Further the second $Si_{0.7}Ge_{0.3}$ film 4 had a low defect density (threading dislocation density of about $1\times10^3/cm^2$).

Figure 2D:
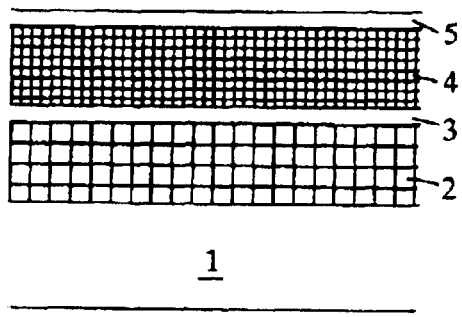

Subsequently, as shown in FIG. 2(d), a second pseudomorphic Si cap film 5 was epitaxially grown to a thickness of 20 nm on the relaxed smooth second SiGe film 4 at 500° C. by the LP-CVD apparatus. Since the second Si cap film 5 was totally matched with the totally relaxed second $Si_{0.7}Ge_{0.3}$ film 4, a targeted tensile strain was able to be sufficiently obtained.

Thereafter a semiconductor device was completed by forming a gate insulating film, a gate electrode, source/drain regions, an interlayer insulating film, a contact hole, a contact plug and a wiring layer according to a usual semiconductor production process.

Embodiment 2

A semiconductor device was formed in the same manner as in Embodiment 1 except that a first $Si_{0.5}Ge_{0.5}$ film of 100 nm thickness was formed as the first SiGe film and the first Si cap film was 10 nm thick.

Figure 4A:
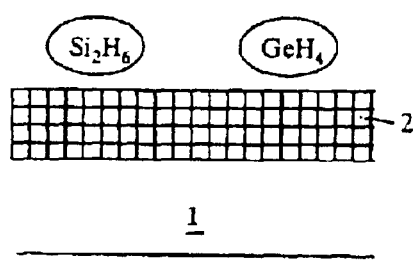
FIGS. 4(a) to 4(f) are schematic sectional views of a major part illustrating a process for producing a semiconductor device in accordance with another embodiment of the present invention.
Figure 4B:
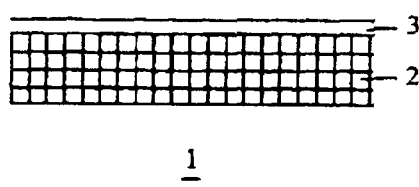

First, as shown in FIG. 4(a), a first SiGe film 2 was formed on a silicon substrate 1, and a first Si cap film 3 was formed thereon as shown in FIG. 4(b).

Figure 4C:
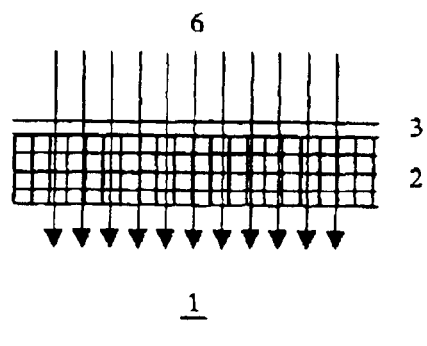

Thereafter, for preventing the contamination with impurities during ion implantation, an oxide film (not shown) of 20 nm thickness was formed on the first Si cap film 3, and as shown in FIG. 4(c), hydrogen ions 6 were implanted into the silicon substrate 1 through the oxide film under the conditions of an implantation energy of 12 keV, a dose of $3\times10^{16}/cm^2$ and a tilt angle of 7°.

Figure 4D:
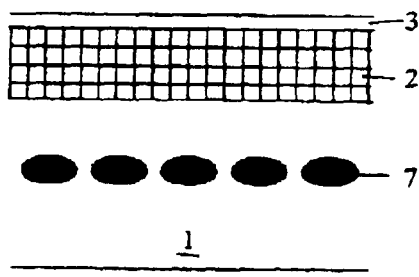

Subsequently, the resulting silicon substrate was RCA-cleaned and annealed at 800° C. for 10 minutes to form a defect layer 7 as shown in FIG. 4(d). Thereafter, the oxide film was etched away with a 5% dilute hydrofluoric acid and the resulting substrate was RCA-cleaned. Thereby, the first $Si_{0.5}Ge_{0.5}$ film 2 was relaxed substantially 59.2%.

Figure 4E:
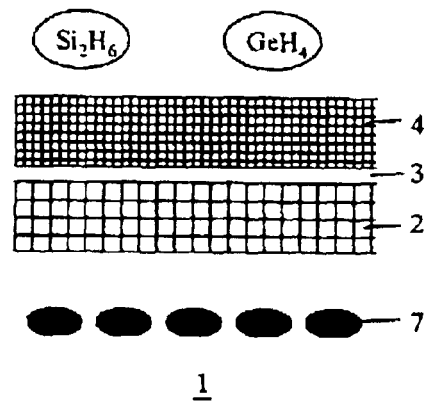
Figure 4F:
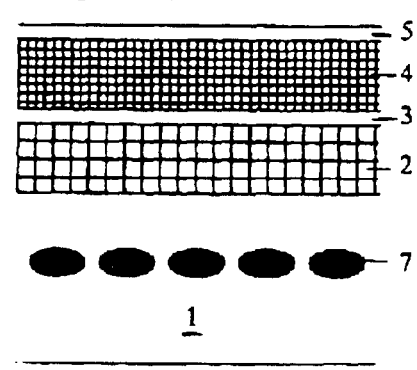

Thereafter, as in Embodiment 1, a second SiGe film 4 was formed as shown in FIG. 4(e) and a second Si cap film 5 was formed as shown in FIG. 4(f). Then the semiconductor device was completed by a usual process.

Embodiment 3

A semiconductor device was produced in the same manner as in Embodiment 1 except that the first Si cap film was not formed of Si but was formed of SiC of a diamond structure.

With use of the first cap film formed of SiC whose lattice constant was smaller than that of Si, the roughness of the surface was able to be suppressed more.

Embodiment 4

A semiconductor device was produced in the same manner as in Embodiment 1 except that the first Si cap film was not formed of Si but was formed of a SiGe film having a low Ge concentration (10% or less).

That is, when $\alpha$ of the first $Si_{1-\alpha}Ge_\alpha$ film 2 is large, the resilience of the first Si cap film becomes high and the first Si cap film is sometimes relaxed partially. This partial relaxation was prevented by use of the SiGe film having a low Ge concentration as the cap layer.

Embodiment 5

A semiconductor device was produced in the same manner as in Embodiment 1 except that a SOI substrate whose surface layer was formed of single-crystal silicon was used instead of the silicon substrate.

Thereby, the increase of parasitic capacity was prevented and the floating capacity was reduced.

According to the present invention, since the first $Si_{1-\alpha}Ge_\alpha$ film is relaxed to have substantially the same lattice constant as that of the second $Si_{1-\beta}Ge_\beta$ film in the unstrained state, the second $Si_{1-\beta}Ge_\beta$ film is formed without any strain and with a smooth surface regardless of the thickness and the Ge concentration of the first $Si_{1-\alpha}Ge_\alpha$ film. Therefore, the second Si cap film can have sufficient strain therein, and a semiconductor device can be obtained which provides a remarkably improved mobility of carriers.

Even if the first $Si_{1-\alpha}Ge_\alpha$ film is thick (for example, thicker than the critical thickness), the resilience of the film is high or the first and second SiGe films have very different Ge concentrations, the relaxation by annealing the first $Si_{1-\alpha}Ge_{\alpha}$ film allows the second $Si_{1-\beta}Ge_{\beta}$ film formed thereon to have no strain and have a surface having good smoothness.

Furthermore, if the first $Si_{1-\alpha}Ge_{\alpha}$ film is thin (for example, thinner than the critical thickness) or the first and second SiGe films have slightly different Ge concentrations, the annealing of the first $Si_{1-\alpha}Ge_{\alpha}$ film after ion implantation allows the totally relaxed second $Si_{1-\beta}Ge_{\beta}$ film to be formed.

Since the second $Si_{1-\beta}Ge_{\beta}$ film is totally relaxed already in its formation step, it does not have excessive resilience therein, and therefore, the second $Si_{1-\beta}Ge_{\beta}$ film can be formed to have a very smooth surface.

Further, since the second $Si_{1-\beta}Ge_{\beta}$ film need not be formed while being positively relaxed, it can be formed at as low a temperature as possible, and therefore, the defect density in the second $Si_{1-\beta}Ge_{\beta}$ film can be remarkably decreased.

What is claimed is:

1. A semiconductor device comprising
a first $Si_{1-\alpha}Ge_{\alpha}$ film, a first cap film, a second $Si_{1-\beta}Ge_{\beta}$ film ($\beta<\alpha\leq$) and a second cap film sequentially formed in this order on a substrate whose surface comprises silicon,
wherein the first $Si_{1-\alpha}Ge_{\alpha}$ film is relaxed to have substantially the same lattice constant as that of the second $Si_{1-\beta}Ge_{\beta}$ film in a horizontal plane, while the first $Si_{1-\alpha}Ge_{\alpha}$ film has a higher Ge concentration than does the second $Si_{1-\beta}Ge_{\beta}$ film.

2. A semiconductor device according to claim 1, wherein the first cap film is a silicon film, a SiC film or a SiGe film having a Ge concentration lower than the Ge concentrations of the first and second SiGe films.

3. A semiconductor device according to claim 1, wherein the substrate whose surface is formed of silicon is a SOI substrate.

4. A semiconductor device according to claim 1, wherein the thickness of the first SiGe film is a critical thickness or smaller.

5. A semiconductor device according to claim 1, wherein the second $Si_{1-\beta}Ge_{\beta}$ film is substantially totally relaxed.

6. The semiconductor device of claim 1, wherein each of the first and second cap films comprises an Si film.

* * * * *